United States Patent
Nun et al.

(10) Patent No.: US 8,057,851 B2
(45) Date of Patent: Nov. 15, 2011

(54) CERAMIC WALL CLADDING COMPOSITES WITH ELECTROMAGNETIC SHIELDING PROPERTIES

(75) Inventors: Edwin Nun, Billerbeck (DE); Heike Bergandt, Marl (DE); Andreas Gutsch, Luedinghausen (DE); Gerhard Geipel, Haltern am See (DE)

(73) Assignee: Evonik Degussa GmbH, Essen (DE)

( * ) Notice: Subject to any disclaimer, the term of this patent is extended or adjusted under 35 U.S.C. 154(b) by 806 days.

(21) Appl. No.: 12/093,025

(22) PCT Filed: Dec. 7, 2006

(86) PCT No.: PCT/EP2006/069415
§ 371 (c)(1),
(2), (4) Date: May 8, 2008

(87) PCT Pub. No.: WO2007/087925
PCT Pub. Date: Aug. 9, 2007

(65) Prior Publication Data
US 2008/0280050 A1 Nov. 13, 2008

(30) Foreign Application Priority Data
Jan. 11, 2006 (DE) .................. 10 2006 001 639

(51) Int. Cl.
B05B 5/00 (2006.01)
(52) U.S. Cl. .................. 427/160; 427/376.1; 427/383.1; 427/418; 428/210; 156/711
(58) Field of Classification Search .................. None
See application file for complete search history.

(56) References Cited

U.S. PATENT DOCUMENTS

| | | | |
|---|---|---|---|
| 4,965,408 A | 10/1990 | Chapman et al. | |
| 6,096,173 A | 8/2000 | Von Hippel et al. | |
| 6,458,750 B1 | 10/2002 | Dardin et al. | |
| 7,235,298 B2 | 6/2007 | Katusic et al. | |
| 7,288,501 B2 | 10/2007 | Auer et al. | |
| 7,374,743 B2 | 5/2008 | Katusic et al. | |
| 7,525,788 B2 | 4/2009 | Hoerpel et al. | |
| 2001/0036437 A1 | 11/2001 | Gutsch et al. | |
| 2001/0055639 A1 | 12/2001 | Moritz et al. | |
| 2003/0206854 A1 | 11/2003 | Gutsch et al. | |
| 2005/0221192 A1 | 10/2005 | Hennige et al. | |
| 2006/0141223 A1 | 6/2006 | Oles et al. | |
| 2006/0147675 A1 | 7/2006 | Nun et al. | |
| 2006/0156475 A1 | 7/2006 | Oles et al. | |
| 2006/0172641 A1 * | 8/2006 | Hennige et al. | 442/59 |
| 2007/0175362 A1 | 8/2007 | Gutsch et al. | |
| 2007/0184993 A1 | 8/2007 | Scherer et al. | |
| 2007/0213237 A1 | 9/2007 | Scherer et al. | |
| 2007/0219101 A1 | 9/2007 | Scherer et al. | |
| 2007/0254178 A1 | 11/2007 | Nun | |
| 2008/0020190 A1 * | 1/2008 | Nun et al. | 428/210 |
| 2008/0032197 A1 | 2/2008 | Horpel et al. | |
| 2008/0084686 A1 | 4/2008 | Gutsch et al. | |
| 2008/0138700 A1 | 6/2008 | Horpel et al. | |
| 2009/0078485 A1 | 3/2009 | Gutsch et al. | |
| 2010/0000079 A1 | 1/2010 | Horpel et al. | |
| 2010/0003401 A1 | 1/2010 | Horpel et al. | |

FOREIGN PATENT DOCUMENTS

| | | |
|---|---|---|
| DE | 23 42 801 | 4/1975 |
| DE | 28 42 519 | 4/1980 |
| EP | 1 139 710 | 10/2001 |
| WO | 2005 018297 | 2/2005 |

OTHER PUBLICATIONS

U.S. Appl. No. 12/067,855, filed Mar. 24, 2008, Nun, et al.
U.S. Appl. No. 12/092,086, filed Apr. 30, 2008, Nun, et al.
U.S. Appl. No. 12/092,084, filed Apr. 30, 2008, Nun, et al.
U.S. Appl. No. 12/159,103, filed Jun. 25, 2008, Nun, et al.
U.S. Appl. No. 12/094,321, filed May 20, 2008, Nun, et al.
U.S. Appl. No. 12/161,031, filed Jul. 16, 2008, Nun, et al.
U.S. Appl. No. 60/021,600, filed Jul. 11, 1996, Riemenschneider, et al.
U.S. Appl. No. 08/842,775, filed Apr. 17, 1997, Riemenschneider, et al.
U.S. Appl. No. 09/441,439, filed Nov. 17, 1999, Barthold, et al.
U.S. Appl. No. 60/194,367, filed Apr. 4, 2002, Michael, et al.
U.S. Appl. No. 12/746,683, filed Jun. 7, 2010, Hedrich, et al.

* cited by examiner

Primary Examiner — Necholus Ogden, Jr.
(74) Attorney, Agent, or Firm — Oblon, Spivak, McClelland, Maier & Neustadt, L.L.P.

(57) ABSTRACT

The present invention relates to a method for coating substrates, comprising the steps of:
a) preparing a substrate,
b) applying a composition onto at least one side of the substrate, the composition containing an inorganic compound, the inorganic compound containing at least one metal and/or semimetal selected from the group Sc, Y, Ti, Zr, Nb, V, Cr, Mo, W, Mn, Fe, Co, B, Al, In, Tl, Si, Ge, Sn, Zn, Pb, Sb, Bi or mixtures thereof and at least one element selected from the group Te, Se, S, O, Sb, As, P, N, C, Ga or mixtures thereof, and an electrically conductive substance selected from metals, particulate metals, metal alloys, particulate metal alloys, conductive compounds containing carbon or mixtures thereof,
c) drying the composition applied in step b),
d) applying at least one coating onto the at least one side of the substrate onto which the composition was applied in step b), the coating containing a silane of the general formula $(Z^1)Si(OR)_3$, where $Z^1$ is R, OR or Gly (Gly=3-glycidyloxypropyl) and R is an alkyl radical having from 1 to 18 carbon atoms and all R may be identical or different, oxide particles selected from the oxides of Ti, Si, Zr, Al, Y, Sn, Zn, Ce or mixtures thereof, and an initiator, the coating preferably containing 3-aminopropyltrimethoxysilane and/or 3-aminopropyltriethoxysilane and/or N-2-aminoethyl-3-aminopropyltrimethoxysilane, and
e) drying the coating applied in step d),
as well as to the coated substrate.

35 Claims, No Drawings

CERAMIC WALL CLADDING COMPOSITES WITH ELECTROMAGNETIC SHIELDING PROPERTIES

The subject-matter of the present invention relates to a method for producing coated substrates with electromagnetically shielding properties, and to substrates which can be obtained by the aforementioned method.

More and more devices which emit electromagnetic radiation have been developed in the recent past for a very wide variety of applications. Examples include modern communication devices such as mobile telephones, as well as data links such as W-LAN connections. It is not currently possible to predict the further applications which will appear in the near future. Loudspeaker systems which operate wirelessly may also be mentioned by way of example.

Furthermore, applications which operate with electromagnetic radiation are also used widely in medical technology. Nuclear spin tomographs, without which modern medicine would scarcely be conceivable, are an example which may be mentioned. A disadvantage with such devices is that they emit magnetic radiation which is so strong that e.g. persons with pacemakers can be detrimentally affected, insofar as the pacemaker no longer functions properly.

The radiation put out by mobile radio transmission masts is also thought to have a detrimental effect on the health of people who live in the vicinity of such masts.

A very wide variety of ways in which rooms can be shielded against penetrating electromagnetic radiation are known from the prior art. A so-called Faraday cage is an example which may be mentioned here. For interference-proof shielding, the room is usually lined with copper foil. This must be done both on the walls as well as on the ceiling and the floor, since secure shielding cannot be ensured otherwise. Highly elaborately produced seals or adhesive tapes or grilles, which offer shielding against electromagnetic radiation, are furthermore available for a region of such a room which is particularly difficult geometrically.

In all the prior art methods and the materials used, the substances employed are very difficult to process. A room lined with copper foil can be achieved only with great difficulty. Such lining with copper foil is also very difficult to remove, so that highly demanding extra work is entailed when the copper foil needs to be removed.

Copper foils cannot be used for domestic application, e.g. in order to protect against the radiation from a mobile radio mast. They are too difficult to process for such rooms, which are most commonly used privately. Such shielding is furthermore very cost-intensive, so that lining with a coating that shields the electromagnetic radiation is generally unfeasible merely for this reason.

It is a technical object of the present invention to overcome the disadvantages of the prior art, and in particular to provide a coated substrate having electromagnetically shielding properties and a method for its production, with which shielding against electromagnetic radiation is reliably ensured, the substrate can be produced more cost-effectively and with which the lining of rooms is simplified. A further intention is to reduce the quantitative proportion of substances which effect the electromagnetic shielding.

The technical object of the present invention is achieved by a method for coating substrates, comprising the steps of:
a) preparing a substrate,
b) applying a composition onto at least one side of the substrate, the composition containing an inorganic compound, the inorganic compound containing at least one metal and/or semimetal selected from the group Sc, Y, Ti, Zr, Nb, V, Cr, Mo, W, Mn, Fe, Co, B, Al, In, Tl, Si, Ge, Sn, Zn, Pb, Sb, Bi or mixtures thereof and at least one element selected from the group Te, Se, S, O, Sb, As, P, N, C, Ga or mixtures thereof, and an electrically conductive substance selected from metals, particulate metals, metal alloys, particulate metal alloys, conductive compounds containing carbon or mixtures thereof,
c) drying the composition applied in step b),
d) applying at least one coating onto the at least one side of the substrate onto which the composition was applied in step b), the coating containing a silane of the general formula $(Z^1)Si(OR)_3$, where $Z^1$ is R, OR or Gly (Gly=3-glycidyloxypropyl) and R is an alkyl radical having from 1 to 18 carbon atoms and all R may be identical or different, oxide particles selected from the oxides of Ti, Si, Zr, Al, Y, Sn, Zn, Ce or mixtures thereof, and an initiator, the coating preferably containing 3-aminopropyltrimethoxysilane and/or 3-aminopropyltriethoxysilane and/or N-2-aminoethyl-3-aminopropyltrimethoxysilane, and
e) drying the coating applied in step d).

The method of the present invention is not limited to any specific substrates. The substrates may be either open-pored or closed-pored. The substrate in step a) may preferably be a flexible and/or rigid substrate. In a preferred embodiment, the substrate in step a) is a cloth, a fabric, a mesh, a foil, a textile and/or sheet metal. It is also preferable for the substrate to be a paper substrate.

Preferably, the substrate in step a) is essentially thermally stable at a temperature of more than 100° C. In a further preferred embodiment, the substrate in step a) is essentially thermally stable under the drying conditions of step c) and/or e). In this context, the term "thermally stable" is intended to mean that the structure of the substrate is essentially unchanged by drying the applied coatings.

In a preferred embodiment, the inorganic compound of step b) is selected from $TiO_2$, $Al_2O_3$, $SiO_2$, $ZrO_2$, $Y_2O_3$, BC, SiC, $Fe_2O_3$, SiN, SiP, alumosilicates, aluminum phosphates, zeolites, partially exchanged zeolites or mixtures thereof. Preferred zeolites are e.g. ZSM-5, Na-ZSM-5 or Fe-ZSM-5, or amorphous microporous mixed oxides which may contain up to 20 percent of non-hydrolyzable organic compounds, e.g. vanadium oxide-silicon oxide glass or aluminum oxide-silicon oxide-methylsilicon sesquioxide glasses.

The inorganic compound of step b) preferably has a particle size of from 1 nm to 10,000 nm, more preferably from 5 nm to 5000 nm, preferably from 10 nm to 2000 nm, in a further preferred embodiment from 10 to 1000 nm, preferably from 15 nm to 700 nm and most preferably from 20 nm to 500 nm. It may be preferable for the composite material according to the invention to comprise at least two particle size fractions of the at least one inorganic compound. It may likewise be preferable for the substrate according to the invention to comprise at least two particle size fractions of at least two inorganic compounds. The particle size ratio may be from 1:1 to 1:10,000, preferably from 1:1 to 1:100. The quantity ratio of the particle size factions in the composition of step b) may preferably be from 0.01:1 to 1:0.01. The composition of step b) is preferably a suspension, which is preferably an aqueous suspension. The suspension may preferably comprise a liquid selected from water, alcohol, acid or a mixture thereof.

The composition of step b) is preferably a suspension, and more preferably an aqueous suspension.

The inorganic compound of step b) is preferably obtained by hydrolyzing a precursor of the inorganic compound containing the metal and/or semimetal. The hydrolysis may be carried out e.g. using water and/or alcohol. An initiator which is preferably an acid or base, and which is preferably an aqueous acid or base, may be present during the hydrolysis.

The precursor of the inorganic compound is preferably selected from metal nitrate, metal halide, metal carbonate, metal alcoholate, metal halide, semimetal alcoholate or mixtures thereof. Preferred precursors are e.g. titanium alcoholates, e.g. titanium isopropylate, silicon alcoholates, e.g. tetraethoxysilane, zirconium alcoholates. Preferred metal nitrates are e.g. zirconium nitrate. In a preferred embodiment, the composition contains at least half the molar ratio of water, water vapor or ice in relation to the hydrolyzable precursor, expressed in terms of the hydrolyzable group of the precursor.

In a preferred embodiment, the composition of step b) is a sol. In a preferred embodiment it is possible to use commercially available sols, e.g. titanium nitrate sol zirconium nitrate sol or silica sol.

In a further preferred embodiment, the conductive substance is selected from copper, aluminum, iron, silver, tin, zinc, carbon, magnesium, calcium, cobalt, manganese, gold, titanium, chromium, molybdenum, tungsten, silicon or alloys thereof.

The conductive substance is preferably selected from powders, sequins, strips or mixtures thereof. In a further preferred embodiment, the conductive substance has a mass-average particle size of from 0.05 µm to 10 µm. The particle size preferably lies in the range of from 0.1 µm to 5 µm, 0.15 µm to 2 µm, 0.2 µm to 1 µm and most preferably 0.25 µm to 0.8 µm.

When the method of the present invention has been carried out, the coated substrate has a conductivity of more than $10^{-4}$ S/cm. The conductivity of the coated substrate is preferably more than $10^{-3}$ S/cm and most preferably more than $5 \times 10^{-3}$ S/cm.

The composition of step b) preferably contains an initiator. The initiator may preferably be an acid or base, which is preferably an aqueous acid or base. In a further preferred embodiment, the composition of step b) is a sol.

The composition of step b) is preferably produced by firstly preparing a dispersion of the inorganic compound. The electrically conductive substance is then subsequently dispersed in it.

The drying of the composition in step c) is preferably carried out by heating to a temperature of between 50° C. and 1000° C. In a preferred embodiment, it is dried for from 1 minute to 2 hours at a temperature of from 50° C. to 100° C.

In another preferred embodiment, the drying is carried out for from 1 second to 10 minutes at a temperature of from 100° C. to 800° C. in step d).

The drying of step c) may be carried out by means of warmed air, hot air, infrared radiation, microwave radiation or electrically generated heat.

In a preferred embodiment, R in the general formula $(Z^1)Si(OR)_3$ is an alkyl radical having 1, 2, 3, 4, 5, 6, 7, 8, 9, 10, 11, 12, 13, 14, 15, 16, 17 and/or 18 carbon atoms.

In a preferred embodiment, the coating of step d) contains a second silane of the general formula $(Z^2)_zSi(OR)_{4-z}$, where R is an alkyl radical having from 1 to 6 carbon atoms and $Z^2$ is $H_aF_bC_n$, a and b being whole numbers, all R may be identical or different, a+b=1+2n, z=1 or 2 and n is from 1 to 16, or for the case that $Z^1$ Gly, $Z^2$ is Am (Am=3-aminopropyl) with z=1. Preferably, n is 1, 2, 3, 4, 5, 6, 7, 8, 9, 10, 11, 12, 13, 14, 15 and/or 16. In a preferred embodiment, R in the general formula $(Z^2)Si(OR)_3$ is an alkyl radical having 1, 2, 3, 4, 5, 6, 7, 8, 9, 10, 11, 12, 13, 14, 15 and/or 16 carbon atoms.

In a further preferred embodiment, the coating of step d) contains 3-glycidyloxypropyltriethoxysilane and/or 3-glycidyloxypropyltrimethoxysilane as the silane and/or 3-aminopropyltrimethoxysilane and/or 3-aminopropyltriethoxysilane and/or N-2-aminoethyl-3-aminopropyltrimethoxysilane (DAMO) as the second silane. The coating of step d) preferably contains tetraethoxysilane as the silane and a silane of the formula $(H_aF_bC_n)_zSi(OR)_{4-z}$ as the second silane, where a and b are whole numbers, a+b=1+2n, z is 1 or 2, n is from 1 to 16 and all R may be identical or different, all R preferably being identical and containing from 1 to 6 carbon atoms.

The coating of step d) more preferably contains tetraethoxysilane, methyltriethoxysilane, octyltriethoxysilane and/or hexadecyltrimethoxysilane as the silane and/or 3,3,4,4,5,5,6,6,7,7,8,8,8-tridecafluoroctyltriethoxysilane as the second silane.

In a preferred embodiment, the coating of step d) contains an acid or base as initiator, which is preferably an aqueous acid or base.

The surface of the oxide particles contained in the coating of step d) is preferably hydrophobic. There are preferably organic radicals $X_{1+2n}C_n$ bound to silicon atoms on the surface of the oxide particles of the coating of step d), when n is from 1 to 20 and X is hydrogen and/or fluorine. The organic radicals may be identical or different. Preferably, n is 1, 2, 3, 4, 5, 6, 7, 8, 9, 10, 11, 12, 13, 14, 15, 16, 17, 18, 19 and/or 20. The groups bound to silicon atoms are preferably methyl, ethyl, propyl, butyl and/or pentyl groups. In a particularly preferred embodiment, trimethylsilyl groups are bound to the surface of the oxide particles. The organic residues may preferably be cleaved, and more preferably hydrolyzed.

The oxide particles of the coating of step d) may be selected from the oxides of Ti, Si, Zr, Al, Y, Sn, Zn, Ce or contain mixtures thereof. Preferably, the oxide particles of the coating of step d) are partially hydrolyzed on the surface of the oxide particles under the reaction conditions of step d). Reactive centers are preferably formed thereby, which react with the organic silicon compounds of the coating of step d). These organic silicon compounds may be bound covalently to the oxide particles by e.g. —O-bonds during the drying of step e). The oxide particles are thereby crosslinked with the cured coating. Therefore, the layer thickness of the cured coating can surprisingly be increased further.

The oxide particles may have an average particle size of from 10 to 1000 nm, preferably from 20 to 500 nm, more preferably from 30 to 250 nm. If the coating is to be transparent and/or colorless, then it is preferable to use only oxide particles which have an average particle size of from 10 to 250 nm. The average particle size refers to the particle size of the primary particles or, if the oxides are present as aggregates, to the size of the aggregates. The particle size is determined by light scattering methods, for example using a device of the type HORIBA LB 550® (from Retsch Technology).

The coating of step d) preferably contains a polymer. In the coating of step d), the polymer preferably has a mean mass-average molecular weight of at least 3000 g/mol. The mean mass-average molecular weight is preferably at least 5000 g/mol, more preferably at least 6000 g/mol and most preferably at least 10,000 g/mol.

The polymer of the coating of step d) preferably has an average degree of polymerization of at least 50. In a further preferred embodiment, the average degree of polymerization is at least 80, more preferably at least 95 and most preferably at least 150. The polymer of the coating of step d) is preferably selected from polyamide, polyester, epoxy resins, melamine-formaldehyde condensate, urethane-polyol resin or mixtures thereof.

Enough coating is preferably applied onto the substrate in step d) for there to be a layer of the dried coating with a layer thickness of from 0.05 to 10 µm after drying in step e). There is preferably a coating of step d) with a layer thickness of from 0.1 µm to 9 µm, more preferably from 0.2 µm to 8 µm and most preferably from 0.3 µm to 7 µm on the dried substrate.

The drying of the coating in step e) may be carried out by any method which is known to the person skilled in the art. In particular, the drying may be carried out in an oven. The drying is more preferably carried out with a hot air oven, circulating air oven, microwave oven or by infrared irradiation. In particular, the drying may preferably be carried out with the method and the drying times of step c). In a preferred embodiment, the coating of step e) is dried by heating to a temperature of between 50° C. and 1000° C.

In a further preferred embodiment, at least one further coating may be applied before the application of the coating in step b) and/or d). This further coating may e.g. be an impression. Such an impression may be applied by any printing method which is familiar to the person skilled in the art, in particular the offset printing method, flexo printing method, tampon printing or inkjet printing method.

In a further embodiment, at least one further coating may be applied after the application of the coating in step d). This further coating is not limited and may be any coating which is known to the person skilled in the art. In particular, this coating may also be an impression. In this case as well, the impression may be applied by any method which is familiar to the person skilled in the art, in particular the offset printing method, flexo printing method, tampon printing or inkjet printing method.

Coated substrates of the present invention surprisingly exhibit a very high flexibility. If the substrate is flexible, then the substrate can be bent without destroying or tearing the applied coatings. In particular, coatings may thereby be applied onto flexible nonwovens which fit to the surface contour of a background, without detrimentally affecting the coating. As mentioned above, a very wide variety of protective layers can be applied as a coating, in particular layers protecting against aggressive chemicals or dirt-repellent coatings.

It is furthermore surprising that the coated substrates of the present invention exhibit sufficient shielding against electromagnetic radiation. The coated substrates can be used as a substitute for metal foils, particularly copper foil or aluminum foil for shielding rooms against electromagnetic radiation. The fact that the coated substrates produce a shielding performance comparable to that of copper or aluminum foil was not expected by the person skilled in the art.

The present invention also relates to the coated substrate which can be obtained by the aforementioned method. The coated substrate preferably has a conductivity of more than $10^{-4}$ S/cm. The conductivity of the coated substrate is preferably more than $10^{-3}$ S/cm, and most preferably more than $5 \times 10^{-3}$ S/cm.

The coated substrate is preferably wallpaper for lining rooms.

The invention claimed is:

1. A method for coating substrates, comprising the steps of:
a) preparing a substrate,
b) applying a composition onto at least one side of the substrate, the composition containing an inorganic compound, the inorganic compound containing at least one metal and/or semimetal selected from the group Sc, Y, Ti, Zr, Nb, V, Cr, Mo, W, Mn, Fe, Co, B, Al, In, Tl, Si, Ge, Sn, Zn, Pb, Sb, Bi or mixtures thereof and at least one element selected from the group Te, Se, S, O, Sb, As, P, N, C, Ga or mixtures thereof, and an electrically conductive substance selected from metals, particulate metals, metal alloys, particulate metal alloys, conductive compounds containing carbon or mixtures thereof,
c) drying the composition applied in step b),
d) applying at least one coating onto the at least one side of the substrate onto which the composition was applied in step b), the coating containing a silane of the general formula $(Z^1)Si(OR)_3$, where $Z^1$ is R, OR or Gly (Gly=3-glycidyloxypropyl) and R is an alkyl radical having from 1 to 18 carbon atoms and all R may be identical or different, oxide particles selected from the oxides of Ti, Si, Zr, Al, Y, Sn, Zn, Ce or mixtures thereof, and an initiator, the coating preferably containing 3-aminopropyltrimethoxysilane and/or 3-aminopropyltriethoxysilane and/or N-2-aminoethyl-3-aminopropyltrimethoxysilane, and
f) drying the coating applied in step d).

2. The method as claimed in claim 1,
wherein
the substrate in step a) is a flexible or rigid substrate.

3. The method as claimed in claim 1,
wherein
the substrate in step a) is a cloth, a fabric, a mesh, a foil or a textile.

4. The method as claimed in claim 1,
wherein
the substrate in step a) is essentially thermally stable at a temperature of more than 100° C.

5. The method as claimed in claim 1,
wherein
the substrate in step a) is essentially thermally stable under the drying conditions of step c) and/or e).

6. The method as claimed in claim 1,
wherein
the inorganic compound of step b) is selected from $TiO_2$, $Al_2O_3$, $SiO_2$, $ZrO_2$, $Y_2O_3$, BC, SiC, $Fe_2O_3$, SiN, SiP, alumosilicates, aluminum phosphates, zeolites, partially exchanged zeolites or mixtures thereof.

7. The method as claimed in claim 1,
wherein
the inorganic compound of step b) has a particle size of from 1 nm to 10,000 nm.

8. The method as claimed in claim 1,
wherein
the composition of step b) is a suspension, which is an aqueous suspension.

9. The method as claimed in claim 1,
wherein
the inorganic compound of step b) is obtained by hydrolyzing a precursor of the inorganic compound containing the metal and/or semimetal.

10. The method as claimed claim 9,
wherein
the precursor of the inorganic compound is selected from metal nitrate, metal halide, metal carbonate, metal alcoholate, semimetal halide, semimetal alcoholate or mixtures thereof.

11. The method as claimed in claim 1,
wherein
the conductive substance is selected from copper, aluminum, iron, silver, tin, zinc, carbon, magnesium, calcium, cobalt, manganese, gold, titanium, chromium, molybdenum, tungsten, silicon or alloys thereof.

12. The method as claimed in claim 1,
wherein
the conductive substance is selected from powders, sequins, strips or mixtures thereof.

13. The method as claimed in claim 1, wherein the conductive substance has a mass-average particle size of from 0.05 μm to 10 μm.

14. The method as claimed in claim 1, wherein the coated substrate has a conductivity of more than $10^{-4}$ S/cm.

15. The method as claimed in claim 1, wherein the composition of step b) contains an initiator.

16. The method as claimed in claim 15, wherein the initiator is an acid or base, which is preferably an aqueous acid or base.

17. The method as claimed in claim 1, wherein the composition of step b) is a sol.

18. The method as claimed in claim 1, wherein the drying of the composition in step c) is carried out by heating to a temperature of between 50° C. and 1000° C.

19. The method as claimed in claim 1, wherein the coating of step d) contains a second silane of the general formula $(Z^2)_z Si(OR)_{4-z}$, where R is an alkyl radical having from 1 to 8 carbon atoms and $Z^2$ is $H_a F_b C_n$, a and b being whole numbers, all R may be identical or different, a+b=1+2n, z=1 or 2 and n is from 1 to 16, or for the case that $Z^1$ is Gly, $Z^2$ is Am (Am=3-aminopropyl) with z=1.

20. The method as claimed in claim 1, wherein the coating of step d) contains 3-glycidyloxypropyltriethoxysilane or 3-glycidyloxypropyltrimethoxysilane as the silane or 3-aminopropyltrimethoxysilane or 3-aminopropyltriethoxysilane and/or N-2-aminoethyl-3-aminopropyltrimethoxysilane as the second silane.

21. The method as claimed in claim 1, wherein the coating of step d) contains tetraethoxysilane as the silane and a silane of the formula $(H_a F_b C_n)_z Si(OR)_{4-z}$ as the second silane, where a and b are whole numbers, a+b=1+2n, z is 1 or 2, n is from 1 to 16 and all R may be identical or different, all R being identical and containing from 1 to 6 carbon atoms.

22. The method as claimed in claim 1, wherein the coating of step d) contains tetraethoxysilane, methyltriethoxysilane, octyltriethoxysilane or hexadecyltrimethoxysilane as the silane or 3,3,4,4,5,5,6,6,7,7,8,8,8-tridecafluorooctyltriethoxysilane as the second silane.

23. The method as claimed in claim 1, wherein the coating of step d) contains an acid or base as initiator, which is an aqueous acid or base.

24. The method as claimed in claim 1, wherein the surface of the oxide particles contained in the coating of step d) is hydrophobic.

25. The method as claimed in claim 1, wherein there are organic radicals $X_{1+2n}C_n$ bound to silicon atoms on the surface of the oxide particles of the coating of step d), when n is from 1 to 20 and X is hydrogen and/or fluorine.

26. The method as claimed in claim 1, wherein the coating of step d) contains a polymer which preferably has a mean mass-average molecular weight of at least 3000 g/mol.

27. The method as claimed in claim 1, wherein the polymer of the coating of step d) has an average degree of polymerization of at least 50.

28. The method as claimed in claim 1, wherein the polymer of the coating of step d) is selected from polyamide, polyester, epoxy resins, melamine-formaldehyde condensate, urethane-polyol resin or mixtures thereof.

29. The method as claimed in claim 1, wherein enough coating is applied onto the substrate in step d) for there to be a layer of the dried coating with a layer thickness of from 0.05 to 10 μm after drying in step e).

30. The method as claimed in claim 1, wherein at least one further coating is applied before the application of the coating in step b) and/or d).

31. The method as claimed in claim 1, wherein at least one further coating is applied after the application of the coating in step d).

32. The method as claimed in claim 1, wherein the drying of the coating in step e) is carried out by heating to a temperature of between 50° C. and 1000° C.

33. A coated substrate which can be obtained as claimed in claim 1.

34. The substrate as claimed in claim 33, wherein it is wallpaper.

35. A method of using the coated substrate as claimed in claim 33 as wallpaper.

* * * * *